(12) United States Patent
Chang et al.

(10) Patent No.: US 12,506,060 B2
(45) Date of Patent: Dec. 23, 2025

(54) PACKAGE SUBSTRATE, CHIP PACKAGE AND INTEGRATED CIRCUIT CHIP

(71) Applicant: VIA Technologies, Inc., New Taipei (TW)

(72) Inventors: Wen-Yuan Chang, New Taipei (TW); Yeh-Chi Hsu, New Taipei (TW); Gao-Tian Lin, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 742 days.

(21) Appl. No.: 17/695,854

(22) Filed: Mar. 16, 2022

(65) Prior Publication Data

US 2022/0359364 A1 Nov. 10, 2022

Related U.S. Application Data

(60) Provisional application No. 63/184,331, filed on May 5, 2021.

(30) Foreign Application Priority Data

Dec. 21, 2021 (TW) .................................. 110147951

(51) Int. Cl.
*H01L 23/498* (2006.01)
*H01L 23/00* (2006.01)

(52) U.S. Cl.
CPC .. *H01L 23/49838* (2013.01); *H01L 23/49822* (2013.01); *H01L 24/16* (2013.01); *H01L 2224/16227* (2013.01)

(58) Field of Classification Search
None
See application file for complete search history.

(56) References Cited

U.S. PATENT DOCUMENTS

2020/0365515 A1* 11/2020 Su ........................ H01L 24/20

FOREIGN PATENT DOCUMENTS

| TW | 201946169 | 12/2019 |
| TW | 202044496 | 12/2020 |

* cited by examiner

*Primary Examiner* — Hung K Vu
(74) *Attorney, Agent, or Firm* — JCIPRNET

(57) ABSTRACT

A package substrate has a substrate surface and a chip region on the substrate surface. The package substrate includes circuit layers, conductive vias, and byte region rows. The circuit layers are sequentially spaced below the substrate surface. Each conductive via is connected to at least two of the circuit layers. The byte region rows are arranged side by side sequentially from an edge of the chip region to a center of the chip region, and each byte region row includes byte regions arranged in a row. Each byte region includes pads located on the circuit layer closest to the substrate surface. The pads of the byte regions of the byte region row closer to the edge of the chip region extend from the chip region to an outside of the chip region through traces of the circuit layer closer to the substrate surface.

25 Claims, 9 Drawing Sheets

PACKAGE SUBSTRATE, CHIP PACKAGE AND INTEGRATED CIRCUIT CHIP

CROSS-REFERENCE TO RELATED APPLICATION

This application claims the priority benefits of U.S. provisional application Ser. No. 63/184,331, filed on May 5, 2021, and Taiwanese application serial no. 110147951, filed on Dec. 21, 2021. The entirety of each of the above-mentioned patent applications is hereby incorporated by reference herein and made a part of this specification.

BACKGROUND

Technical Field

The disclosure relates to a package substrate, in particular to a package substrate, a chip package applying the package substrate, and an integrated circuit chip correspondingly mounted on the package substrate.

Description of Related Art

In the field of integrated circuit (IC) design, Double Data Rate Synchronous Dynamic Random Access Memory (DDR) is an IC chip. The multiple byte region rows of multiple channels used in DDR are usually arranged on the active surface of the IC chip. Therefore, when the number of the byte region rows increases, the arrangement of the byte region rows on the active surface of the IC chip needs to be optimized to improve the area utilization of the IC chip.

SUMMARY

The disclosure provides a package substrate for mounting an integrated circuit chip to improve area utilization of the integrated circuit chip.

The disclosure provides a chip package for packaging an integrated circuit chip to improve the area utilization of the integrated circuit chip.

The disclosure provides an integrated circuit chip to improve the area utilization of the integrated circuit chip.

The package substrate of the disclosure is suitable for mounting an integrated circuit chip by flip chip bonding, and has a substrate surface and a chip region on the substrate surface. The package substrate includes multiple circuit layers, multiple conductive vias, and multiple byte region rows. The circuit layers are sequentially spaced below the substrate surface. Each of the circuit layers has multiple traces. Each of the conductive vias is connected to at least two of the circuit layers. The byte region rows are arranged side by side sequentially from an edge of the chip region to a center of the chip region. Each of the byte regions includes multiple pads, and the pads are located on the circuit layer closest to the substrate surface. The pads of the byte regions of the byte region row closer to the edge of the chip region extend from the chip region to an outside of the chip region through the traces of the circuit layer closer to the substrate surface.

The chip package of the disclosure includes the package substrate and an integrated circuit chip. The integrated circuit chip is mounted on the chip region of the package substrate by flip chip bonding.

The integrated circuit chip of the disclosure is suitable for being mounted on the chip region of the package substrate by flip chip bonding.

Based on the above, in the disclosure, the pads of the byte regions of the byte region row closer to the edge of the chip region extend from the chip region to an outside of the chip region through the traces of the circuit layer closer to the substrate surface. As a result, a number of side-by-side rows of the byte region rows may be increased.

To make the aforementioned more comprehensible, several accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
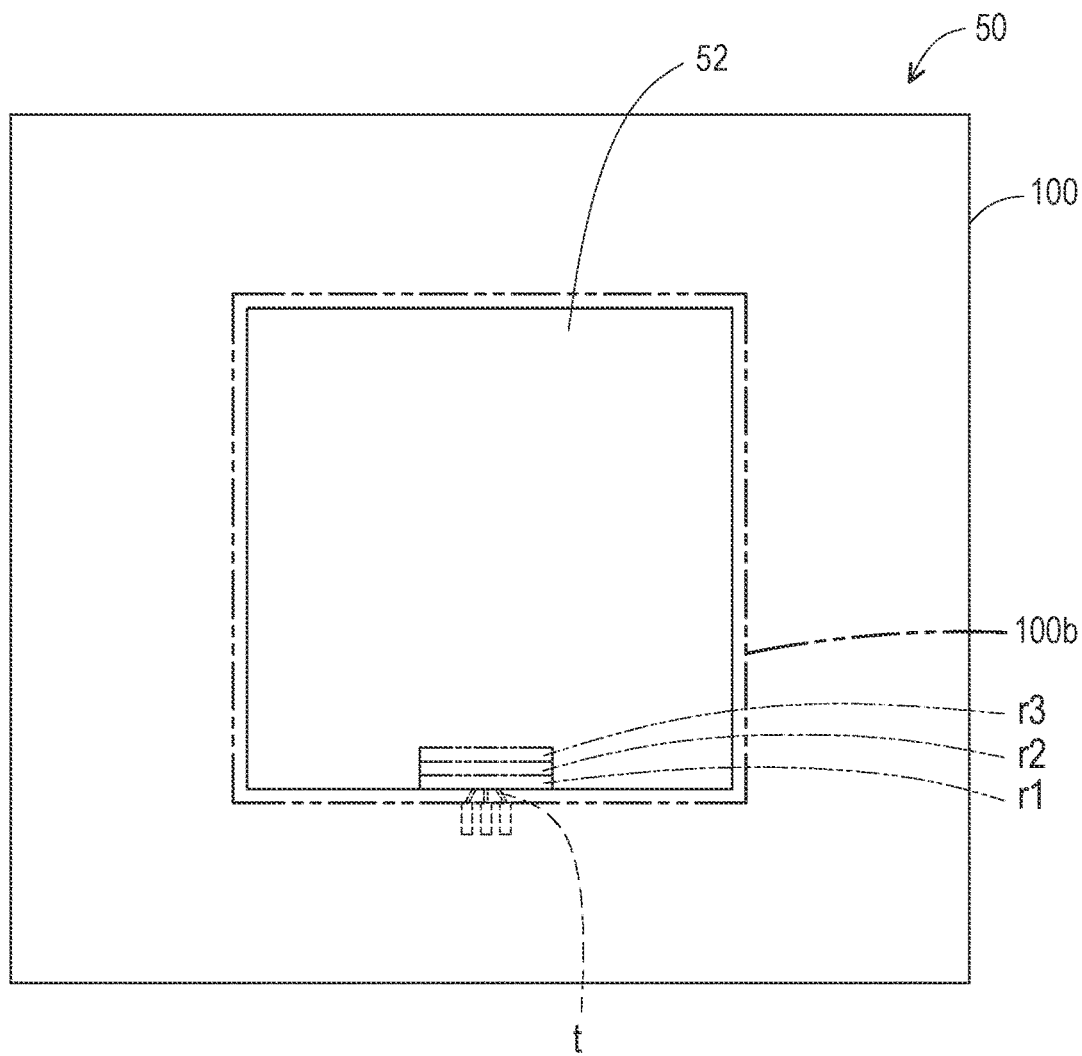
FIG. 1A and FIG. 1B are respectively a top view and a side view of a chip package according to an embodiment of the disclosure.
Figure 1B:
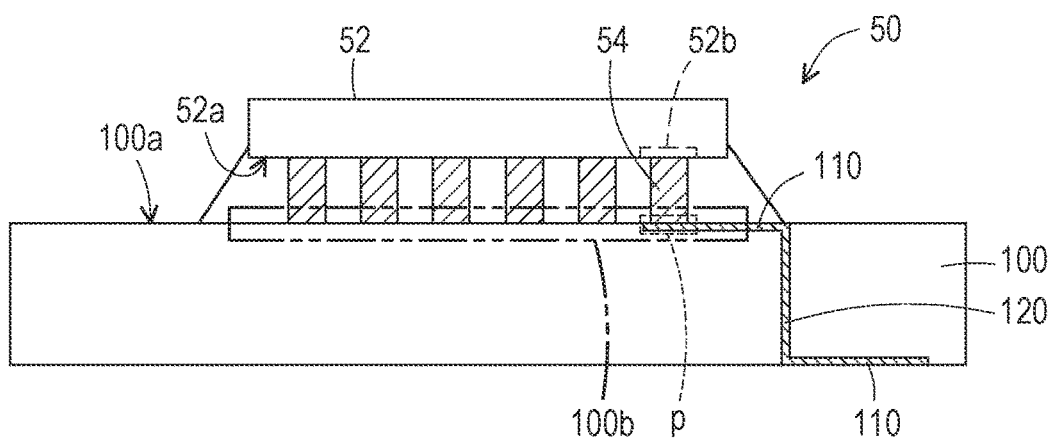

Referring to FIG. 1A and FIG. 1B, according to this embodiment, a chip package 50 includes a chip 52 (i.e., an integrated circuit chip 52) and a package substrate 100. The chip 52 is suitable for being mounted on the package substrate 100 by flip chip bonding. Specifically, the chip 52 has an active surface 52a and multiple chip pads 52b located on the active surface 52a. The package substrate 100 has a substrate surface 100a, a chip region 100b located on the substrate surface 100a, and multiple pads p located in the chip region 100b (see also pad p in FIG. 2). The chip pads 52b of the chip 52 may be mounted to the pads p located in the chip region 100b through multiple conductive bumps 54. According to this embodiment, signal distribution of the pads located in a projection region below the chip 52 is mirrored to the chip pads 52b on the active surface 52a of the chip 52.

Figure 2:
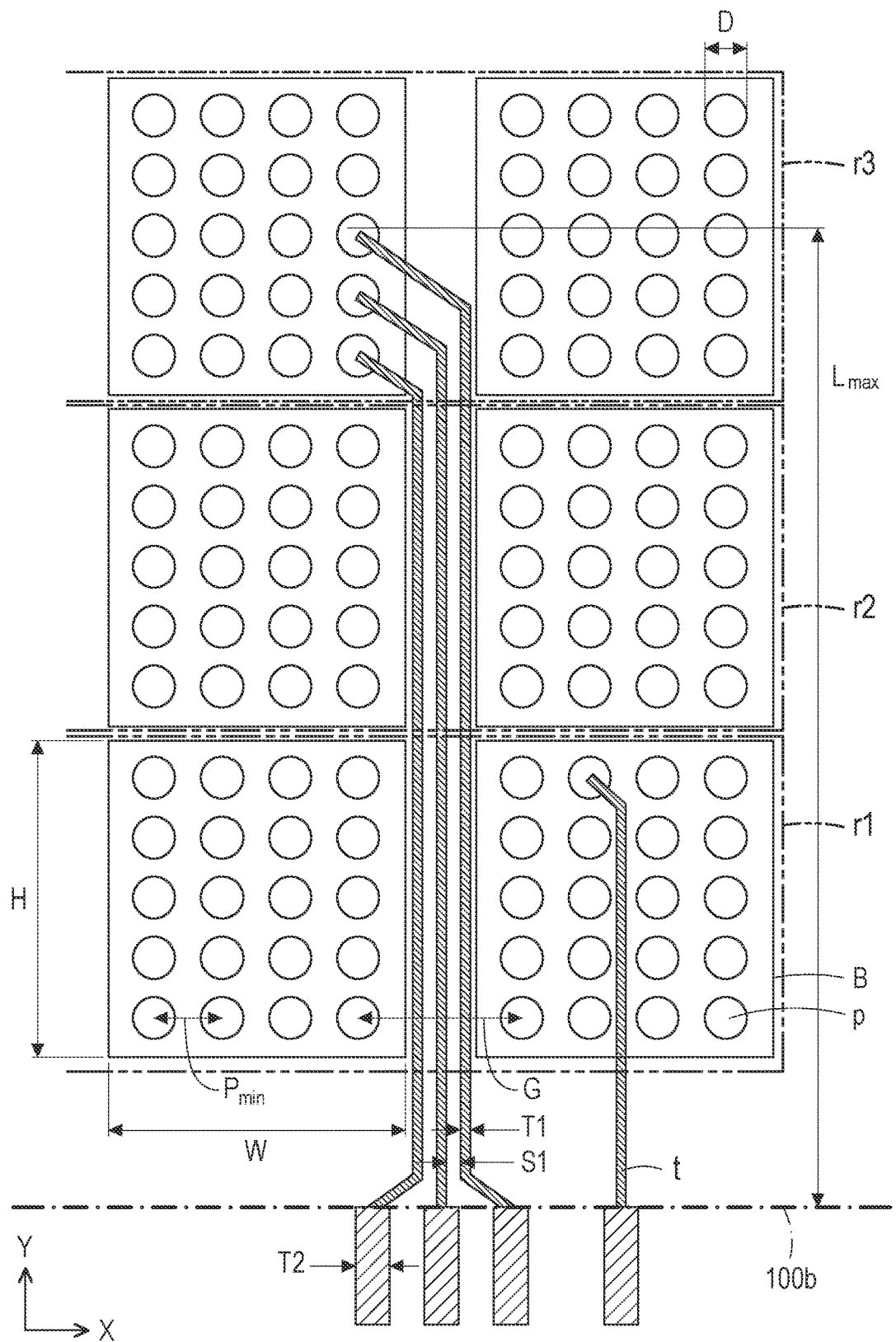
FIG. 2 is a partial top view near a bottom side of a chip region of a package substrate of FIG. 1A.
Figure 3:
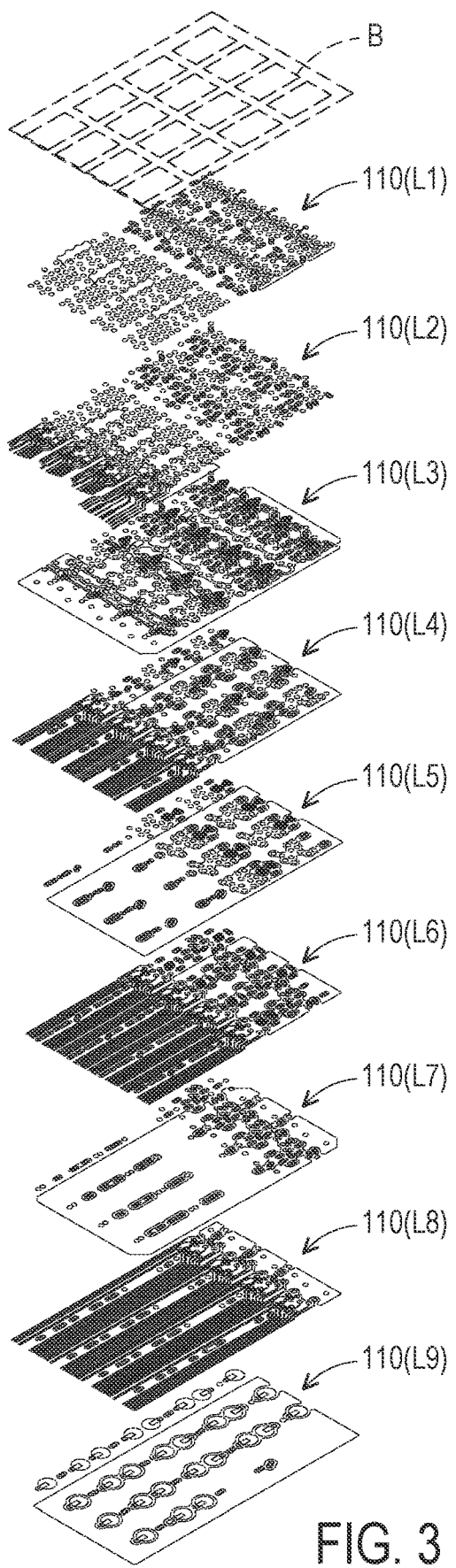
FIG. 3 is a three-dimensional schematic view of multiple byte regions and multiple circuit layers of the package substrate of FIG. 1A.
Figure 4:
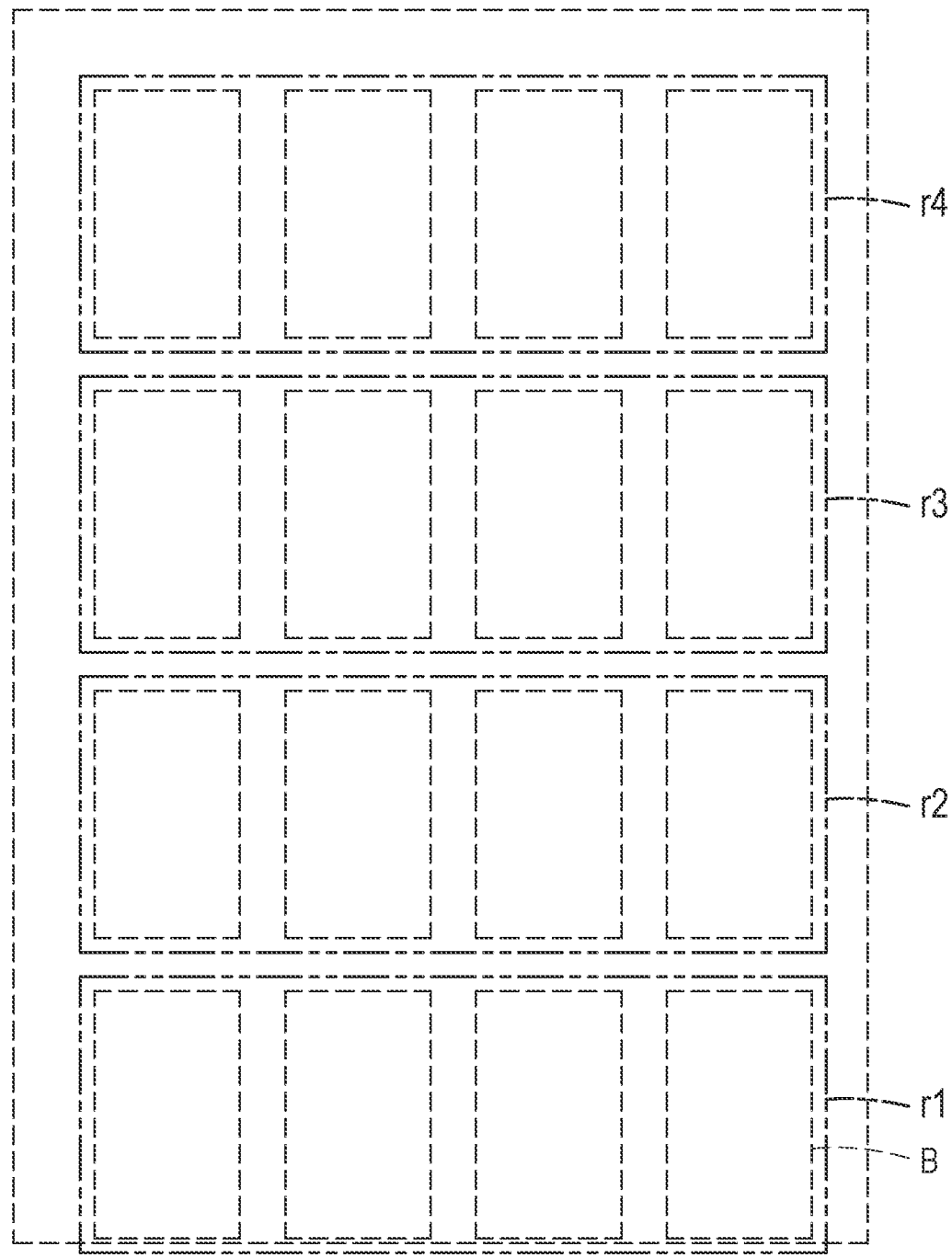
FIG. 4 is a schematic plan view of the byte regions of FIG. 3.
Figure 5:
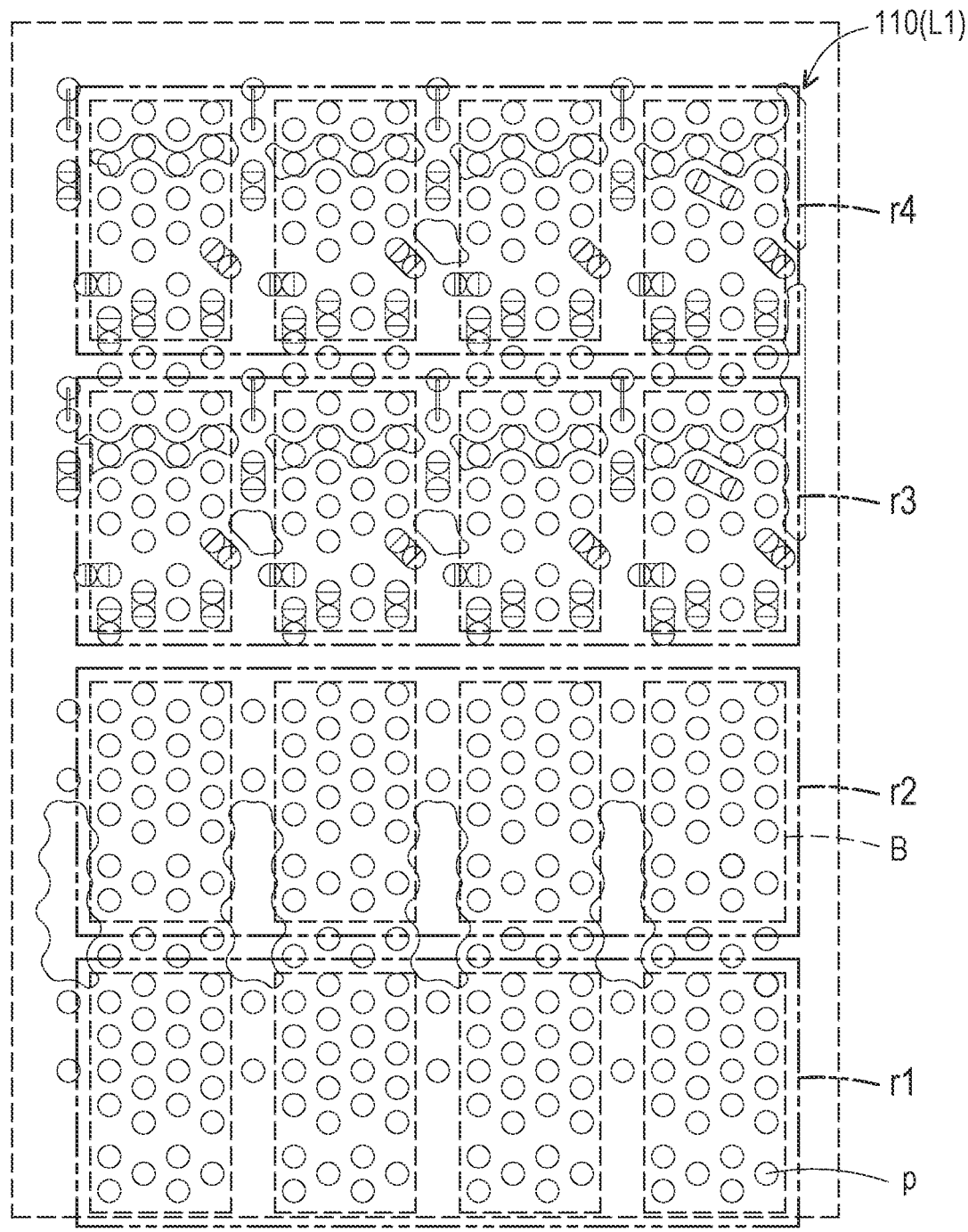
FIG. 5 is a schematic plan view of a first circuit layer 110 (L1) of FIG. 3.
Figure 6:
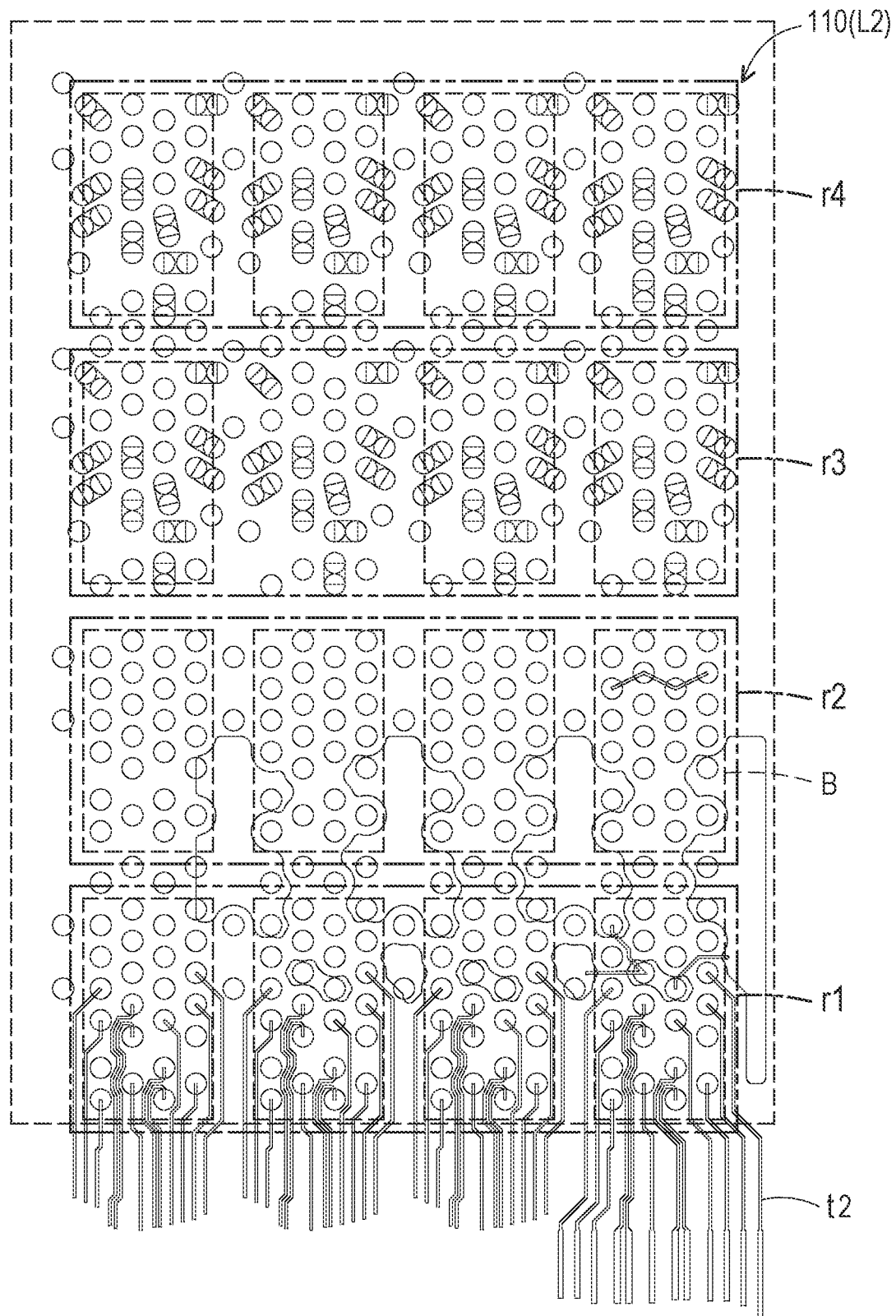
FIG. 6 is a schematic plan view of a second circuit layer 110 (L2) of FIG. 3.
Figure 7:
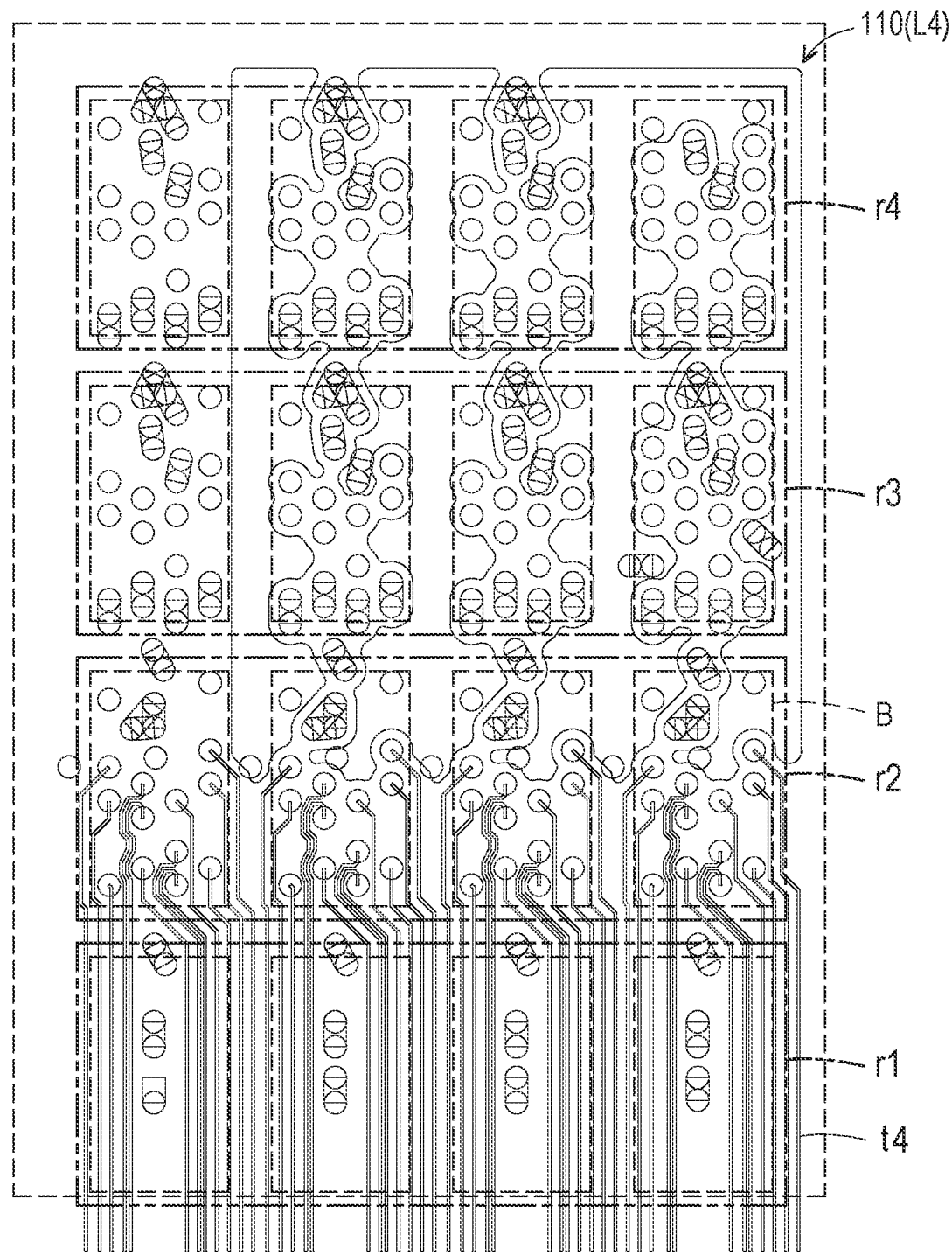
FIG. 7 is a schematic plan view of a fourth circuit layer 110 (L4) of FIG. 3.

Referring to FIG. 1B and FIG. 2 to FIG. 7, according to this embodiment, the package substrate 100 of FIG. 1B includes multiple circuit layers 110 (see also the circuit layers 110 (L1 to L9) of FIG. 3) and multiple conductive vias 120. FIG. 5, FIG. 6, and FIG. 7 are schematic plan views of a first circuit layer 110(L1), a second circuit layer 110(L2), and a fourth circuit layer 110(L4) of FIG. 3, respectively. The circuit layers 110 are sequentially spaced below the substrate surface 100a. Each of the circuit layers 110 has multiple traces t (as shown in FIG. 2, see also in FIG. 6 and FIG. 7). Each of the conductive vias 120 is connected to at least two of the circuit layers 110. In other words, any two of the circuit layers 110 may be electrically connected to each other through the conductive vias 120.

According to this embodiment, under DDR or similar parallel signal applications, the package substrate 100 includes multiple byte region rows. In FIG. 2, three byte region rows r1, r2, and r3 are used as examples, while in FIG. 3 to FIG. 7, four byte region rows r1, r2, r3, and r4 are used as examples. FIG. 2 is a partial top view near a bottom side of the chip region 100b of the package substrate 100 of FIG. 1A, which is constituted by multiple circuit layers 110. As can be seen from FIG. 2, on an orthographic projection plane, the byte region rows r1, r2, and r3 are arranged side by side sequentially from an edge of the chip region 100b to a center of the chip region 100b. By side-by-side, it is meant that the byte region rows r1, r2, and r3 are sequentially arranged adjacent to each other in their length direction parallel to each other. In other words, the byte region rows r1, r2, and r3 are all arranged in a first direction (e.g., Y-direction). Therefore, an edge length in a second direction X-direction) may be reduced, and the edge length corresponding to the second direction (e.g., X-direction) of the chip 52 may also be reduced. Each of the byte region rows r1, r2, and r3 (e.g., r1 or r2 or r3) includes multiple byte regions B arranged in a row. In other words, in the second direction (e.g., X-direction), the byte regions B in the same row form the same byte region row, which support the signal transmission of the same channel (e.g., two byte regions B of the byte region row r1 in FIG. 2 support the signal transmission of the same channel). In addition, corresponding to the each of the byte region rows of the chip 52, the chip pads 52b are arranged in the same way as each other, or in a mirror arrangement. For example, the chip pads 52b constituting the byte region row r1 is arranged in the same manner as the chip pads 52b constituting the byte region row r2. Alternatively, the chip pads 52b constituting the byte region row r1 and the chip pads 52b constituting the byte region row r2 are arranged in such a way that they have a mirror relationship along a symmetrical line.

For the sake of simplicity, a number of the byte regions B in the same byte region row is taken as two in FIG. 2, and the number of the byte regions B in the same byte region row is taken as four in FIG. 4 to FIG. 7, but not limited thereto. Each of the byte regions B includes multiple pads (i.e., the pads p connected to the conductive bumps 54 in FIG. 1B). The pads p may be arranged in parallel (as shown in FIG. 2) or staggered (not shown). The pads p are constituted by the circuit layer 110 closest to the substrate surface 100a (i.e., the circuit layer 110(L1) in FIG. 3).

According to this embodiment, the pads p of the byte regions B of the byte region row r closer to the edge of the chip region 100b extend from the chip region 100b to an outside of the chip region 100b through the traces t of the circuit layer 110 closer to the substrate surface 100a. For example, as shown in the second circuit layer 110(L2) of FIG. 6, the pads p of the byte regions B of the byte region row r1 near the edge of the chip region 100b extend from the chip region 100b to the outside of the chip region 100b through traces t2 of the second circuit layer 110(L2) near the substrate surface 100a, i.e., the pads p of the byte regions B of the byte region row r1 near the edge of the chip region 100b extend from the first circuit layer 110(L1) to the second circuit layer 110(L2) through the conductive vias 120 directly, and then the traces t2 extend from the pads p of the byte regions B of the byte region row r1 of the second circuit layer 110(L2) under the chip region 100b to the region under the outside of the chip region 100b on the second circuit layer 110(L2). On the other hand, the pads p of the byte regions B of the byte region row r further away from the edge of the chip region 100b extend from the chip region 100b to the outside of the chip region 100b through the traces t of the circuit layer 110 further away from the substrate surface 100a. For example, as shown in the fourth circuit layer 110(L4) of FIG. 7, the pads p of the byte regions B of the byte region row r2 further away from the edge of the chip region 100b extend from the chip region 110b to the outside of the chip region 100b through traces t4 of the fourth circuit layer 110(L4) further away from the substrate surface 100a, i.e., the pads p of the byte regions B of the byte region row r2 further away from the edge of the chip region 100b extend from the first circuit layer 110(L1) to the fourth circuit layer 110(L4) through the conductive vias 120 directly, and then the traces t4 extend from the pads p of the byte regions B of the byte region row r2 of the fourth circuit layer 110(L4) under the chip region 100b to the region under the outside of the chip region 100b on the fourth circuit layer 110(L4).

According to this embodiment, under DDR or similar parallel signal applications, the circuit layers 110 include a circuit layer for signal transmission and a circuit layer for power/grounding, and the two circuit layers are electrically connected to each other by the conductive via 120. Moreover, the circuit layers (L2, L4, L6, and L8), which are mainly for signal transmission function, may be located between the two circuit layers (L1 and L3, L3 and L5, L5 and L7, or L7 and L9), which are mainly for power/grounding function, respectively. According to an embodiment not shown, the circuit layers (L2, L4, L6 and L8), which are mainly for power/grounding function, may be located between the two circuit layers (L1 and L3, L3 and L5, L5 and L7 or L7 and L9), which are mainly for signal transmission function. As can be seen from FIG. 3 to FIG. 7, according to this embodiment, assuming that there are four byte region rows r1, r2, r3, and r4 arranged in the first direction (e.g., the Y-direction of FIG. 2) from the edge near the chip region 100b to gradually away from the chip region 100b, the pads p in the byte region rows r1, r2, r3, r4 extend from the chip region 100b to the outside of the chip region 100b through the traces t of the circuit layers 110(L2, L4, L6, and L8) of the substrate surface 100a, respectively. The circuit layer 110(L2), the circuit layer 110(L4), the circuit layer 110(L6), and the circuit layer 110(L8) are gradually away from the substrate surface 100a. Although only the circuit layer 110(L2) and the circuit layer 110(L4) are shown in the figure, it can be inferred that on an orthographic projection plane, in the byte region row r3, the circuit layer 110(L6) is also configured with traces to extend the signal from one region under the chip region 100b to the other region under the outside of the chip region 100b, which is not shown in the figure. In addition, on an orthographic projection plane, in the byte region row r4, the circuit layer 110(L8) is also configured with traces to extend the signal from one region under the chip region 100b to the other region under the outside of the chip region 100b, which is also not shown in the figure.

From the above, it can be seen that, compared with the known technology that arranges sequentially multiple byte region rows in the X-direction of the chip or the package substrate, the disclosure arranges multiple byte region rows sequentially adjacent to each other in their length direction parallel to each other, so as to reduce the edge length of the chip or the package substrate in the X-direction. In addition, the byte region rows r of the disclosure are arranged sequentially along the Y-direction of the chip or the package substrate with their widths, so the byte region rows do not cause a problem of the edge length in the Y-direction of the chip or the package substrate being too long. In particular, the byte region rows r1, r2, r3, and r4 corresponding to the chip pads 52b on the active surface 52a of the chip 52 are arranged side by side sequentially from the edge of the chip region 100b to the center of the chip region 100b, so that the edge length of the chip 52 in the second direction (e.g., X direction) ray be reduced.

Referring to FIG. 2 again, according to this embodiment, $P_{min}$ represents a minimum pitch between two pads (of the bumps), where the pitch is a distance from a center of a pad to a center of an adjacent pad. W represents a width of a function unit (i.e., the byte region B). H represents a height of the function unit (i.e., the byte region B). D represents an outer diameter of the pad p (of the bump 54). G represents a pitch between the two pads p (of the bumps 54) at adjacent edges of two function units (i.e., two byte regions B). T1 represents a width of the signal trace t in the chip region 100b. S1 represents a spacing between the two signal traces t, where the spacing is a distance from an edge of a trace to an edge of an adjacent trace. T2 represents a width of the signal trace t outside the chip region 100b. $L_{max}$ represents a maximum length of the signal trace t in the chip region 100b. n1 represents a number of the signal trace t between two pads p (of the bumps 54). n2 represents a number of the signal trace t between two function units (i.e., byte region B).

According to this embodiment, $P_{min}$=n1T1+(n1+1)S1+D. In other words, the minimum pitch $P_{min}$ between adjacent two of the pads p of one of the byte regions B belonging to a single byte region row (e.g., r1 in FIG. 2) is equal to a sum of the number n1 of the traces t located between the adjacent pads p multiplied by the width T1 of a portion of the traces t under the chip region 100b, the number of the traces t located between the adjacent pads p added by 1 and then multiplied by the spacing S1 of the traces t, and the outer diameter D of any one of the pads p.

According to this embodiment, G=n2T1+(n2+1)S1+D. In other words, the minimum pitch between adjacent two of the byte regions B belonging to a single byte region row (e.g., r3 in FIG. 2) is equal to a sum of the number n2 of the traces t located between the adjacent byte regions B multiplied by a width of a portion of the traces t under the chip region 100b, the number n2 of the traces t located between the adjacent byte regions B added by 1 and then multiplied by a spacing of the traces, and an outer diameter D of any one of the pads p.

According to this embodiment, S1≥2×T1. In other words, the spacing S1 between adjacent two traces t is greater than or equal to twice the width T1 of the traces t in the chip region 100b.

According to this embodiment, impedance of the thinner trace t of T1 is equal to the impedance of the thicker trace t of T2±30%. In other words, the impedance of a portion of each of the thinner trace t under the chip region 100b is 0.7 to 1.3 times of the impedance of a portion of the thicker trace t under the outside of the chip region 100b. The impedance of the trace inside and outside the chip region is related to the width of the trace.

According to this embodiment, $L_{max}$ is greater than 2 mm. In other words, in the case of r3 in FIG. 2, a distance of a portion of each of the traces t under the chip region 100b is greater than 2 mm.

According to this embodiment, G is greater than $P_{min}$. In other words, a pitch between one of the pads p of one of the byte regions B belonging to a single byte region row (e.g., r3 in FIG. 2) and the most adjacent pads p of the byte regions B belonging to the same single byte region row (e.g., r3 in FIG. 2) is greater than the minimum pitch $P_{min}$ between adjacent two of the pads p of one of the byte regions B belonging to the single byte region row (e.g., r3 in FIG. 2).

According to this embodiment, W≤4×$P_{min}$. In other words, each of the byte regions B is located in a byte region B, and a width of the byte region B is less than or equal to four times the minimum pitch $P_{min}$ between adjacent two of the pads p of the byte region B.

According to this embodiment, orthographic projections on the substrate surface 100a of the traces t connected to the pads p of the byte region rows (e.g., r2, r3, r4 with respect to r1) farther from the edge of the chip region 100b overlap with orthographic projections of the pads p on the substrate surface 100a of the byte region rows (e.g., r1) closer to the edge of the chip region 100b. According to some embodiments, the orthographic projections of the traces t connected to the pads p in different byte region rows do not completely overlap on the substrate surface 100a.

Figure 8:
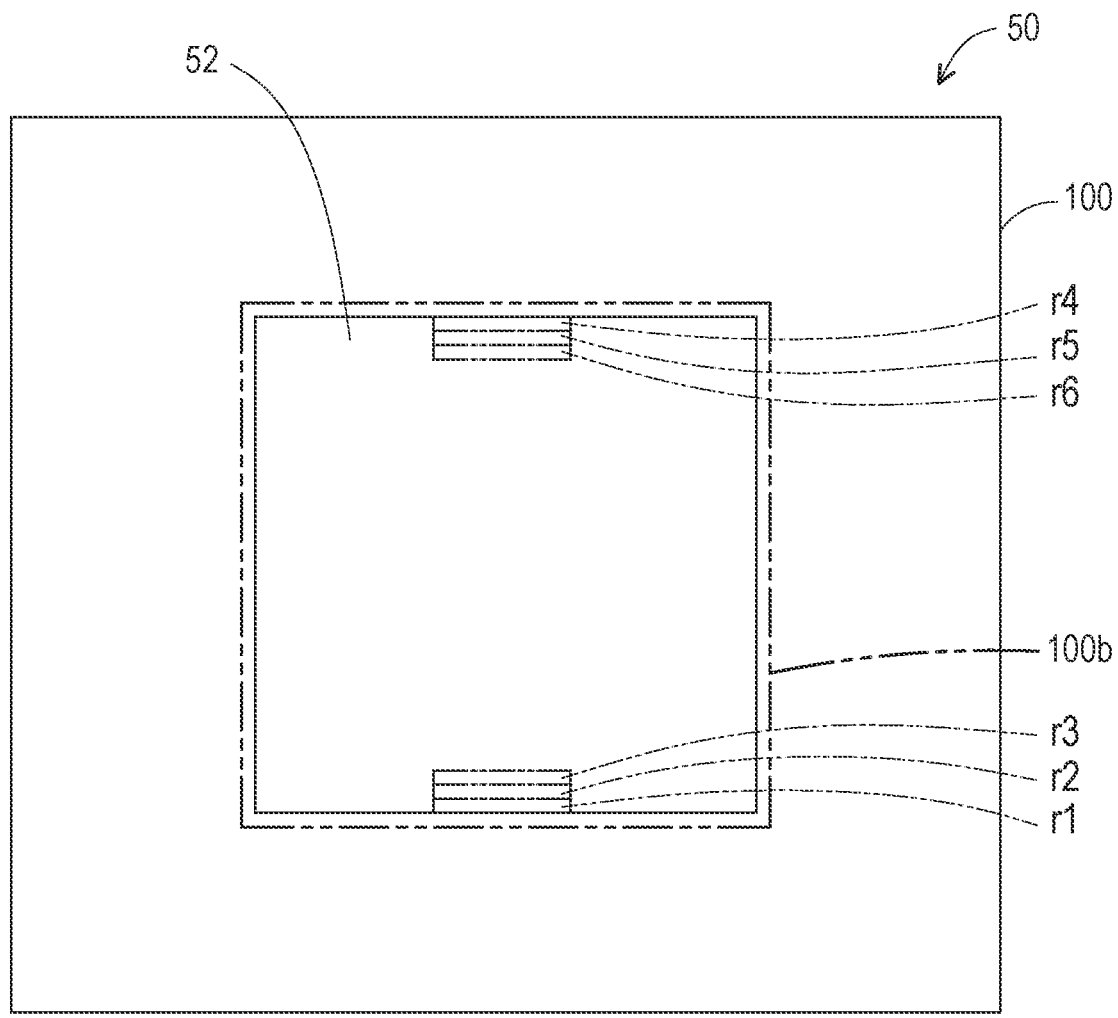
FIG. 8 is a top view of a chip package according to another embodiment of the disclosure.

Referring to FIG. 8, according to this embodiment, the package substrate 100 includes multiple byte region rows r1, r2, and r3. The byte region rows r1, r2, and r3 are arranged side by side sequentially from an edge of the chip region 100b to a center of the chip region 100b. In addition, the package substrate 100 further includes multiple byte region rows r4, r5, and r6. The byte region rows r4, r5, and r6 are arranged side by side sequentially from another edge of the chip region 100b to the center of the chip region 100b. Compared with the known technology that arranges sequentially multiple byte region rows in the X-direction of the chip or the package substrate, the disclosure arranges multiple byte region rows sequentially adjacent to each other in their length direction parallel to each other, so as to reduce the edge length of the chip or the package substrate in the X-direction. In addition, the byte region rows r of the disclosure are arranged sequentially along the Y-direction of the chip or the package substrate with their widths, so the byte region rows do not cause a problem of the edge length in the Y-direction of the chip or the package substrate being too long.

Figure 9:
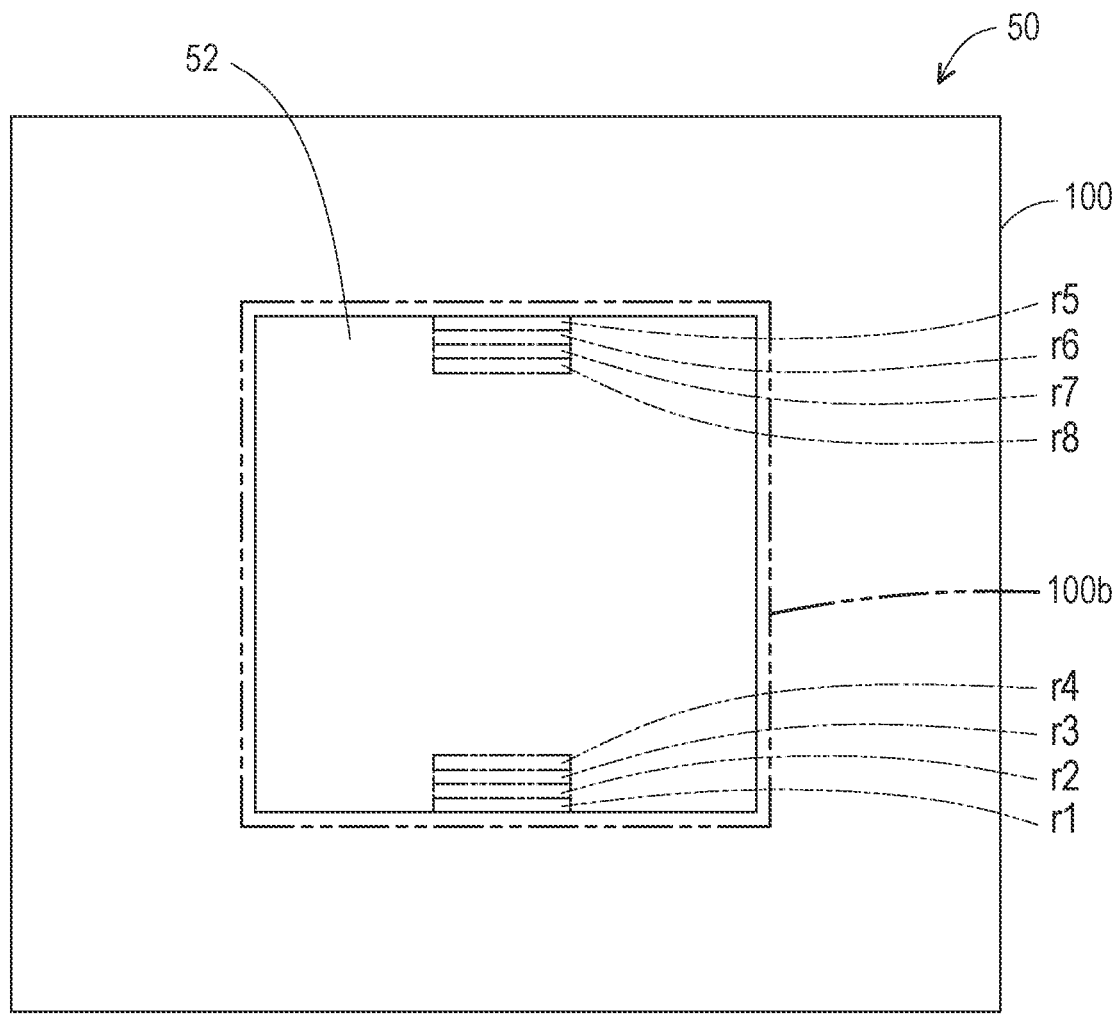
FIG. 9 is a top view of a chip package according to yet another embodiment of the disclosure.

Referring to FIG. 9, according to this embodiment, the package substrate 100 includes multiple byte region rows r1, r2, r3, and r4. The byte region rows r1, r2, r3, and r4 are arranged side by side sequentially from an edge of the chip region 100b to a center of the chip region 100b. In addition, the package substrate 100 further includes multiple byte region rows r5, r6, r7, and r8. The byte region rows r5, r6, r7, and r8 are arranged side by side sequentially from another edge of the chip region 100b to the center of the chip region 100b. Compared with the known technology that arranges sequentially multiple byte region rows in the X-direction of the chip or the package substrate, the disclosure arranges multiple byte region rows sequentially adjacent to each other in their length direction parallel to each other, so as to reduce the edge length of the chip or the package substrate in the X-direction. In addition, the byte region rows r of the disclosure are arranged sequentially along the Y-direction of the chip or the package substrate with their widths, so the byte region rows do not cause a problem of the edge length in the Y-direction of the chip or the package substrate being too long.

To sum up, in the disclosure, in addition to the arrangement of multiple byte region rows, the pads of the byte regions of the byte region row closer to the edge of the chip region extend from the chip region to an outside of the chip region through the traces of the circuit layer closer to the substrate surface. Thus, the number of side-by-side rows of the byte region rows may be increased, and the required length of the edge of the active surface of the chip may be reduced to improve the area utilization of the integrated circuit chip and avoid oversizing the chip.

It will be apparent to those skilled in the art that various modifications and variations can be made to the disclosed without departing from the scope or spirit of the disclosure. In view of the foregoing, it is intended that the disclosure covers modifications and variations provided that they fall within the scope of the following claims and their equivalents.

What is claimed is:

1. A package substrate suitable for mounting an integrated circuit chip by flip chip bonding, and having a substrate surface and a chip region located on the substrate surface, wherein the package substrate comprises:
   a plurality of circuit layers sequentially spaced below the substrate surface, wherein each of the circuit layers has a plurality of traces;
   a plurality of conductive vias, wherein each of the conductive vias is connected to at least two of the circuit layers; and
   a plurality of byte region rows arranged side by side sequentially from an edge of the chip region to a center of the chip region, wherein each of the byte region rows comprises a plurality of byte regions arranged in a row, each of the byte regions comprises a plurality of pads, the pads are located on the circuit layer closest to the substrate surface, the pads are arranged in area array, and the pads of the byte regions of the byte region row closer to the edge of the chip region extend from the chip region to an outside of the chip region through the traces of the circuit layer closer to the substrate surface.

2. The package substrate according to claim 1, wherein a spacing between adjacent two of the traces is greater than or equal to twice a width of the traces.

3. The package substrate according to claim 1, wherein impedance of a portion of each of the traces under the chip region is 0.7 to 1.3 times of impedance of a portion of the trace under the outside of the chip region.

4. The package substrate according to claim 1, wherein a distance of a portion of each of the traces under the chip region is greater than 2 mm.

5. The package substrate according to claim 1, wherein a minimum pitch between adjacent two of the pads of one of the byte regions belonging to a single byte region row is equal to a sum of a number of the traces located between the adjacent pads multiplied by a width of a portion of the traces under the chip region, the number of the traces located between the adjacent pads added by 1 and then multiplied by a spacing of the traces, and an outer diameter of any one of the pads.

6. The package substrate according to claim 1, wherein a minimum pitch between adjacent two of the byte regions belonging to a single byte region row is equal to a sum of a number of the traces located between the adjacent byte regions multiplied by a width of a portion of the traces under the chip region, the number of the traces located between the adjacent byte regions added by 1 and then multiplied by a spacing of the traces, and an outer diameter of any one of the pads.

7. The package substrate according to claim 1, wherein a pitch between one of the pads of one of the byte regions belonging to a single byte region row and the most adjacent pads of the byte regions belonging to the same single byte region row is greater than a minimum pitch between adjacent two of the pads of one of the byte regions belonging to the single byte region row.

8. The package substrate according to claim 1, wherein each of the byte regions is located in a byte region, and a width of the byte region is less than or equal to four times a minimum pitch between adjacent two of the pads of the byte region.

9. A chip package comprising:
   a package substrate having a substrate surface and a chip region located on the substrate surface, wherein the package substrate comprises:
   a plurality of circuit layers sequentially spaced below the substrate surface, wherein each of the circuit layers has a plurality of traces;
   a plurality of conductive vias, wherein each of the conductive vias is connected to at least two of the circuit layers; and
   a plurality of byte region rows arranged side by side sequentially from an edge of the chip region to a center of the chip region, wherein each of the byte region rows comprises a plurality of byte regions arranged in a row, each of the byte regions comprises a plurality of pads, the pads are located on the circuit layer closest to the substrate surface, the pads are arranged in area array, and the pads of the byte regions of the byte region row closer to the edge of the chip region extend from the chip region to an outside of the chip region through the traces of the circuit layer closer to the substrate surface; and
   an integrated circuit chip mounted on the chip region of the package substrate by flip chip bonding.

10. The chip package according to claim 9, wherein a spacing between adjacent two of the traces is greater than or equal to twice a width of the traces.

11. The chip package according to claim 9, wherein impedance of a portion of each of the traces under the chip region is 0.7 to 1.3 times of impedance of a portion of the trace under the outside of the chip region.

12. The chip package according to claim 9, wherein a distance of a portion of each of the traces under the chip region is greater than 2 mm.

13. The chip package according to claim 9, wherein a minimum pitch between adjacent two of the pads of one of the byte regions belonging to a single byte region row is equal to a sum of a number of the traces located between the adjacent pads multiplied by a width of a portion of the traces under the chip region, the number of the traces located between the adjacent pads added by 1 and then multiplied by a spacing of the traces, and an outer diameter of any one of the pads.

14. The chip package according to claim 9, wherein a minimum pitch between adjacent two of the byte regions belonging to a single byte region row is equal to a sum of a number of the traces located between the adjacent byte regions multiplied by a width of a portion of the traces under the chip region, the number of the traces located between the adjacent byte regions added by 1 and then multiplied by a spacing of the traces, and an outer diameter of any one of the pads.

15. The chip package according to claim 9, wherein a pitch between one of the pads of one of the byte regions belonging to a single byte region row and the most adjacent pads of the byte regions belonging to the same single byte region row is greater than a minimum pitch between adjacent two of the pads of one of the byte regions belonging to the single byte region row.

16. The chip package according to claim 9, wherein each of the byte regions is located in a byte region, and a width of the byte region is less than or equal to four times a minimum pitch between adjacent two of the pads of the byte region.

17. An integrated circuit chip suitable for being mounted on a chip region of a package substrate by flip chip bonding, wherein the chip region is located on a substrate surface of the package substrate, and the package substrate comprises:
- a plurality of circuit layers sequentially spaced below the substrate surface, wherein each of the circuit layers has a plurality of traces;
- a plurality of conductive vias, wherein each of the conductive vias is connected to at least two of the circuit layers; and
- a plurality of byte region rows arranged side by side sequentially from an edge of the chip region to a center of the chip region, wherein each of the byte region rows comprises a plurality of byte regions arranged in a row, each of the byte regions comprises a plurality of pads, the pads are located on the circuit layer closest to the substrate surface, the pads are arranged in area array, and the pads of the byte regions of the byte region row closer to the edge of the chip region extend from the chip region to an outside of the chip region through the traces of the circuit layer closer to the substrate surface.

18. The integrated circuit chip according to claim 17, wherein the chip has an active surface and a plurality of chip pads located on the active surface, the package substrate has a plurality of pads located in the chip region, the chip pads are respectively mounted to the pads through a plurality of conductive bumps, and signal distribution of the pads located in a projection region below the chip is mirrored to the chip pads on the active surface of the chip.

19. The integrated circuit chip according to claim 17, wherein a spacing between adjacent two of the traces is greater than or equal to twice a width of the traces.

20. The integrated circuit chip according to claim 17, wherein impedance of a portion of each of the traces under the chip region is 0.7 to 1.3 times of impedance of a portion of the trace under the outside of the chip region.

21. The integrated circuit chip according to claim 17, wherein a distance of a portion of each of the traces under the chip region is greater than 2 mm.

22. The integrated circuit chip according to claim 17, wherein a minimum pitch between adjacent two of the pads of one of the byte regions belonging to a single byte region row is equal to a sum of a number of the traces located between the adjacent pads multiplied by a width of a portion of the traces under the chip region, the number of the traces located between the adjacent pads added by 1 and then multiplied by a spacing of the traces, and an outer diameter of any one of the pads.

23. The integrated circuit chip according to claim 17, wherein a minimum pitch between adjacent two of the byte regions belonging to a single byte region row is equal to a sum of a number of the traces located between the adjacent byte regions multiplied by a width of a portion of the traces under the chip region, the number of the traces located between the adjacent byte regions added by 1 and then multiplied by a spacing of the traces, and an outer diameter of any one of the pads.

24. The integrated circuit chip according to claim 17, wherein a pitch between one of the pads of one of the byte regions belonging to a single byte region row and the most adjacent pads of the byte regions belonging to the same single byte region row is greater than a minimum pitch between adjacent two of the pads of one of the byte regions belonging to the single byte region row.

25. The integrated circuit chip according to claim 17, wherein each of the byte regions is located in a byte region, and a width of the byte region is less than or equal to four times a minimum pitch between adjacent two of the pads of the byte region.

* * * * *